(12) United States Patent
Lakshmikumar

(10) Patent No.: US 6,784,044 B2
(45) Date of Patent: Aug. 31, 2004

(54) HIGH DOPANT CONCENTRATION DIFFUSED RESISTOR AND METHOD OF MANUFACTURE THEREFOR

(75) Inventor: Kadaba R. Lakshmikumar, Basking Ridge, NJ (US)

(73) Assignee: Agere Systems Inc., Allentown, PA (US)

(*) Notice: Subject to any disclaimer, the term of this patent is extended or adjusted under 35 U.S.C. 154(b) by 0 days.

(21) Appl. No.: 10/669,398

(22) Filed: Sep. 24, 2003

(65) Prior Publication Data

US 2004/0075529 A1 Apr. 22, 2004

Related U.S. Application Data

(62) Division of application No. 10/256,466, filed on Sep. 27, 2002, now Pat. No. 6,690,082.
(60) Provisional application No. 60/326,050, filed on Sep. 28, 2001.

(51) Int. Cl.[7] ................. H01L 21/8238; H01L 21/8234; H01L 21/20; H01L 29/00; H01L 31/119
(52) U.S. Cl. ................. 438/210; 438/238; 438/382; 438/383; 438/190; 257/536; 257/528; 257/529; 257/380
(58) Field of Search ................. 257/380, 581, 257/516, 539, 379, 536, 529; 438/210, 238, 382, 383, 384, 385, 190

(56) References Cited

U.S. PATENT DOCUMENTS

| | | | | |
|---|---|---|---|---|
| 5,210,438 A | * | 5/1993 | Nakamura | 257/536 |
| 5,260,595 A | * | 11/1993 | Hayama | 257/379 |
| 5,925,922 A | * | 7/1999 | Rountree et al. | 257/536 |
| 6,057,204 A | * | 5/2000 | Nowak et al. | 438/382 |
| 6,104,277 A | * | 8/2000 | Iniewski et al. | 338/311 |

FOREIGN PATENT DOCUMENTS

JP       405075026 A  *  3/1993  ................. 257/380

* cited by examiner

*Primary Examiner*—Eddie Lee
*Assistant Examiner*—Samuel A Gebremariam

(57) ABSTRACT

The present invention provides a high dopant concentration diffused resistor, a method of manufacture therefor, and an integrated circuit including the same. In one embodiment of the invention, the high dopant concentration diffused resistor includes a doped tub located over a semiconductor substrate and a doped resistor region located in the doped tub, the doped resistor region forming a junction within the doped tub. In a related embodiment, the high dopant concentration diffused resistor further includes first and second terminals each contacting the doped tub and the doped resistor region, wherein the first and second terminals cause the doped tub and doped resistor region to have a zero potential difference at any point across the junction when a voltage is applied to the first and second terminals.

12 Claims, 9 Drawing Sheets

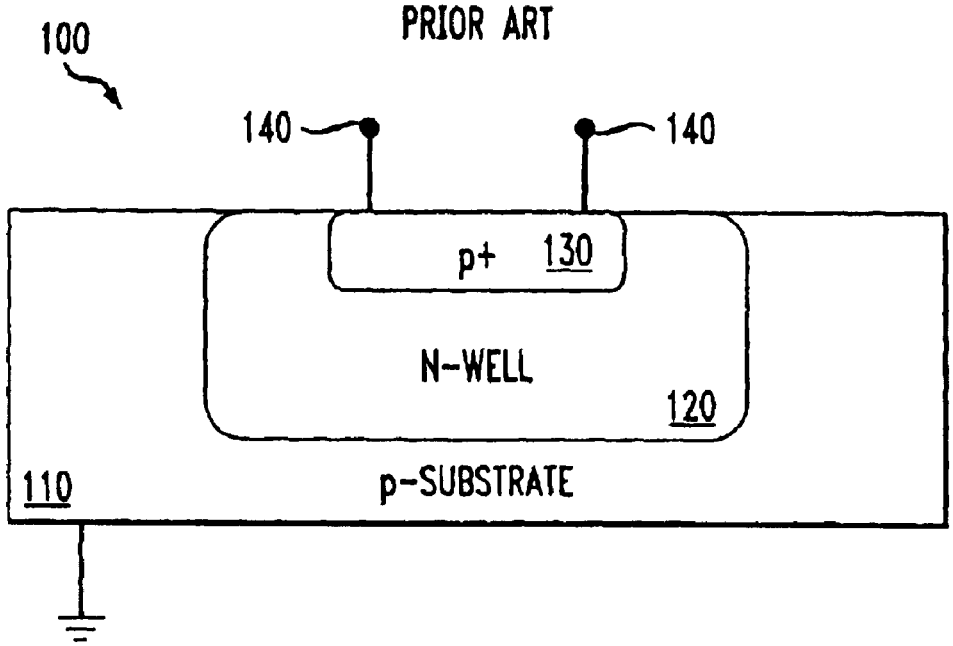
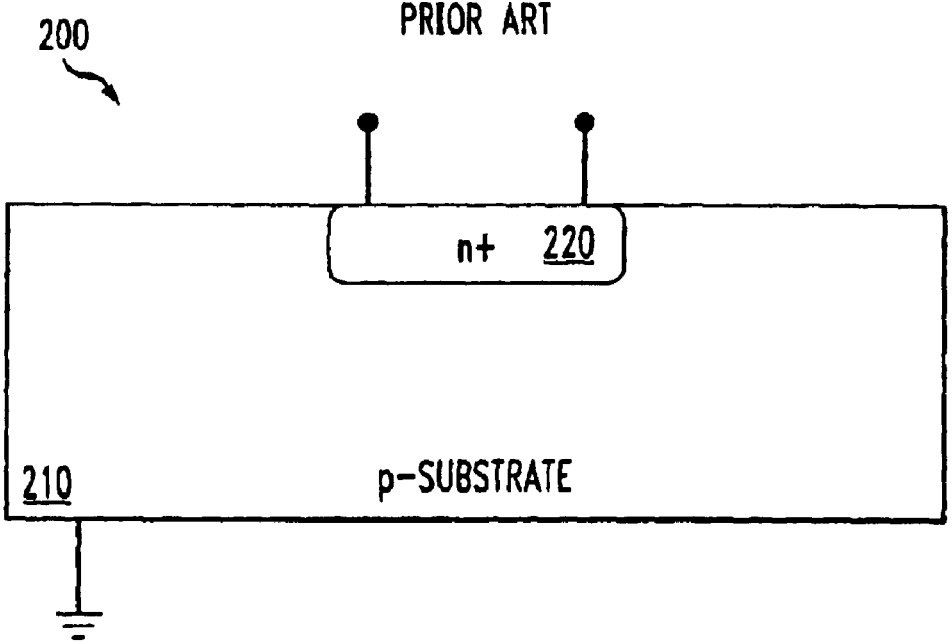

HIGH DOPANT CONCENTRATION DIFFUSED RESISTOR AND METHOD OF MANUFACTURE THEREFOR

CROSS-REFERENCE TO PROVISIONAL APPLICATION

This Application is a Divisional of prior application Ser. No. 10/256,466 filed on Sep. 27, 2002 how U.S. Pat. No. 6,690,082 currently pending, to Kadaba R. Lakshmikumar. The above-listed Application is commonly assigned with the present invention and is incorporated herein by reference as if reproduced herein in its entirety under Rule 1.53(b).

This application claims the benefit of U.S. Provisional Application No. 69/326,050 entitled "RESISTOR LOCATED ON A SEMICONDUCTOR SUBSTRATE AND A METHOD OF MANUFACTURE THEREFOR," to Kadaba R. Lakshmikumar, filed on Sep. 28, 2001, which is commonly assigned with the present invention and incorporated herein by reference as if reproduced herein in its entirety.

TECHNICAL FIELD OF THE INVENTION

The present invention is directed, in general, to integrated circuits and, more specifically, to a high dopant concentration diffused resistor, a method of manufacture therefor, and an integrated circuit including the same.

BACKGROUND OF THE INVENTION

Over the last several decades, the electronics industry has undergone a revolution by the use of semiconductor technology to fabricate small, highly integrated electronic devices. Accordingly, a large variety of semiconductor devices having various applicability and numerous disciplines have been manufactured. One such silicon-based semiconductor device that has gained wide use, is the complementary metal oxide semiconductor (CMOS).

Frequently, CMOS devices are complemented by other devices, such as resistors. For instance, resistors are regularly required in analog CMOS and bipolar CMOS (BiCMOS) semiconductor devices to reduce current spikes associated with such devices. Presently, three broad categories of resistors exist: interconnect resistors, polysilicon resistors, and diffused resistors. Of importance when designing the resistors is precision, resistance values obtainable, low to no voltage dependence and decreased parasitic capacitance. Of the three broad categories of precision resistors, however, only the diffused resistors are consistently capable of providing the precision and resistance values required in today's integrated circuits. For this reason, interconnect resistors and polysilicon resistors are sparingly used.

Diffused resistors are also commonly broken into three categories: n-well diffused resistors, n+ diffused resistors and p+ diffused resistors, wherein the n+ diffused resistors and p+ diffused resistors are often collectively called high dopant concentration diffused resistors. Of the diffused resistors, the n-well diffused resistor is the most problematic. Many of the problems associated with the n-well diffused resistors may be ascribed to these resistors being highly voltage dependent. For this reason, n-well diffused resistors are the least desirable of the diffused resistors.

Turning to Prior Art FIG. 1, illustrated is a conventional p+ diffused resistor 100 as is currently used in the art. As is shown, the conventional p+ diffused resistor 100 includes a conventional n-well 120 formed within a semiconductor substrate 110. As is further illustrated, a p+ resistor region 130 is formed within the n-well 120, wherein the p+ resistor region 130 has contacts 140 contacting either side thereof.

Turning to Prior Art FIG. 2, illustrated is a conventional n+ diffused resistor 200 as is currently used in the art. The n+ diffused resistor 200, in comparison to the p+ diffused resistor 100, does not include the n-well 120 (FIG. 1), but its n+ resistor region 220 is formed directly in its semiconductor substrate 210. Because the semiconductor substrate 210 is p-type doped, the n+ resistor region 220 is sufficiently isolated without using the n-well 120 (FIG. 1).

While both the p+ and n+ diffused resistors 100, 200, are much more desirable than the standard n-well diffused resistor (and especially the interconnect resistors and polysilicon resistors), they do have certain drawbacks. For example, it has been observed that the p+ and n+ diffused resistors 100, 200, do not function as accurately and precisely as required for many of the high frequency devices being manufactured today. More specifically, it has been observed that the bandwidth of the high frequency devices is limited by certain features of the diffused resistors, mainly capacitances that form at the junction between the n-well 120 and the p+ resistor region 130, and the semiconductor substrate 210 and n+ resistor region 220, for the p+ diffused resistor 100 and n+ diffused resistor 200, respectively.

Accordingly, what is needed in the art is a p+ or n+ diffused resistor that may be used in conjunction with higher frequency devices, and that does not experience the parasitic capacitance problems addressed above.

SUMMARY OF THE INVENTION

To address the above-discussed deficiencies of the prior art, the present invention provides a high dopant concentration diffused resistor, a method of manufacture therefor, and an integrated circuit including the same. In one embodiment of the invention, the high dopant concentration diffused resistor includes a doped tub located over a semiconductor substrate and a doped resistor region located in the doped tub, the doped resistor region forming a junction within the doped tub. In a related embodiment, the high dopant concentration diffused resistor further includes first and second terminals each contacting the doped tub and the doped resistor region, wherein the first and second terminals cause the doped tub and doped resistor region to have a zero potential difference at any point across the junction when a voltage is applied to the first and second terminals. Often, this may be accomplished without adding additional processing steps.

In an alternative embodiment of the invention, the high dopant concentration diffused resistor includes a doped tub located over a semiconductor substrate and having a concentration of a first dopant, and a doped resistor region located in the doped tub and having a higher concentration of the first dopant. In a similar embodiment, the resistor further includes a first terminal contacting the doped resistor region at a first location and an opposing second terminal contacting the doped resistor region at a second location, wherein the similar dopant between the doped tub and doped resistor region cause them to have a zero potential difference at any point across a junction therebetween when a voltage is applied to the first and second terminals.

The foregoing has outlined, rather broadly, preferred and alternative features of the present invention so that those skilled in the art may better understand the detailed description of the invention that follows. Additional features of the invention will be described hereinafter that form the subject of the claims of the invention Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

The invention is best understood from the following detailed description when read with the accompanying FIGUREs. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which:

FIG. 1 illustrates a Prior Art p+ diffused resistor;

FIG. 2 illustrates a Prior Art n+ diffused resistor;

DETAILED DESCRIPTION

Figure 3:
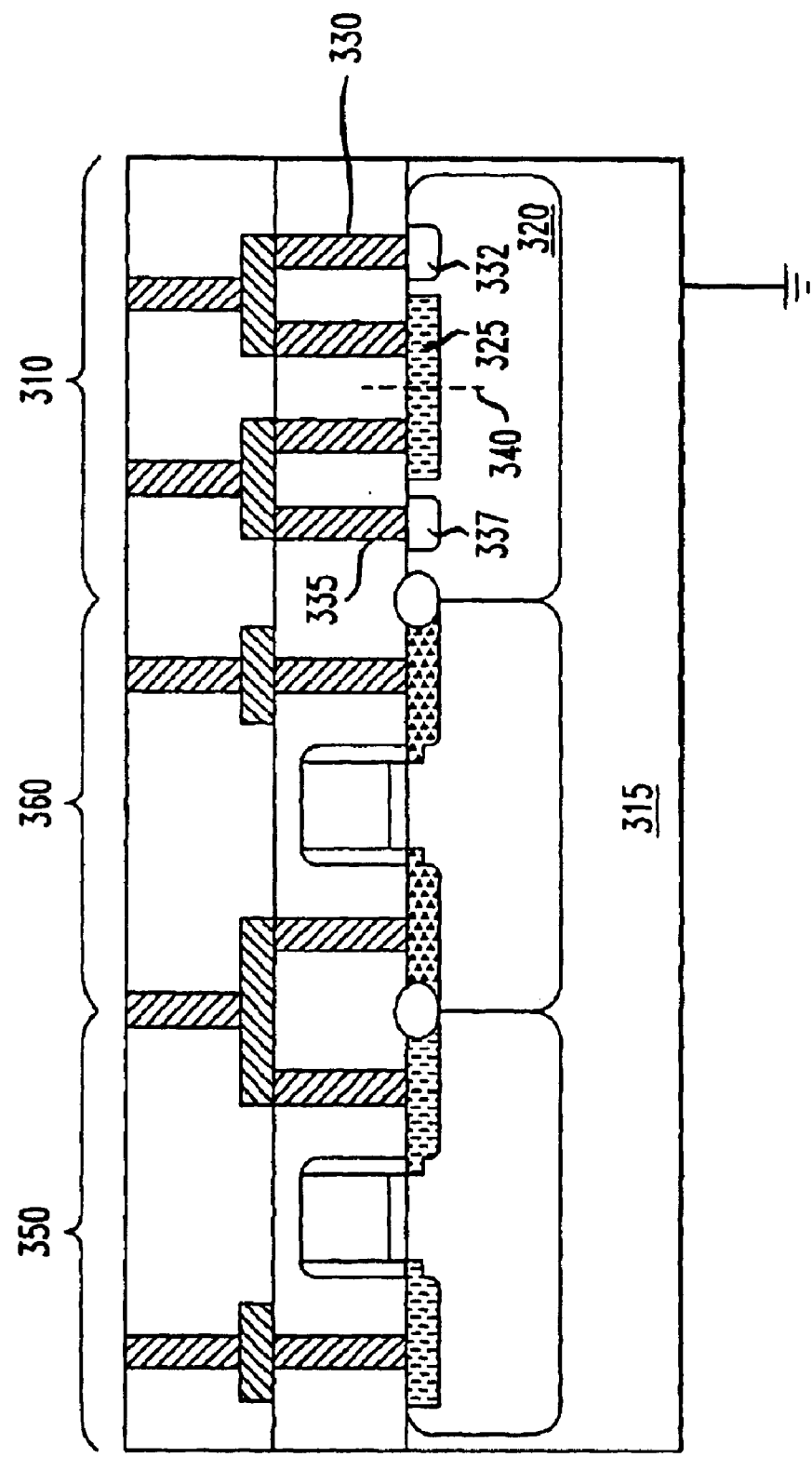
FIG. 3 illustrates a partially completed integrated circuit constructed in accordance with the principles of the present invention, including a high dopant concentration diffused resistor located on a semiconductor substrate.

Referring initially to FIG. 3, illustrated is a cross-sectional view of a partially completed integrated circuit 300 constructed in accordance with the principles of the present invention. The partially completed integrated circuit 300 in the embodiment illustrated in FIG. 3 includes a completed high dopant concentration diffused resistor located over a semiconductor substrate 315, wherein the high dopant concentration diffused resistor in this embodiment happens to be a p+ diffused resistor 310. While the present embodiment focuses on the p+ diffused resistor 310, those skilled in the art understand that any known or hereafter discovered high dopant concentration diffused resistor could be used. In an advantageous embodiment, the completed p+ diffused resistor 310 includes a doped tub 320 located over the semiconductor substrate 315, and a doped resistor region 325 located within the doped tub 320. The completed p+ diffused resistor 310, as illustrated, further includes a first terminal 330 that contacts the doped tub 320 and the doped resistor region 325, and an opposing second terminal 335 that contacts the doped tub 320 and the doped resistor region 325.

Included within the doped tub 320 and the doped resistor region 325 are a first dopant, and a second dopant opposite to the first dopant, respectively. In the particular embodiment shown in FIG. 3, the first dopant comprises an n-type dopant and the second dopant comprises a p-type dopant. Similarly, the semiconductor substrate 315 may comprise the p-type dopant.

In the illustrative embodiment of FIG. 3, ohmic contacts 332, 337, are located at points where the first and second terminals 330, 335, contact the doped tub 320. As those skilled in the art understand, the ohmic contacts 332, 337, may be island regions having a higher dopant concentration of the first dopant than the doped tub 320. Other ohmic contacts 332, 327, are, however, within the scope of the present invention. Also included within the partially completed integrated circuit 300 illustrated in FIG. 3 are conventionally formed transistor regions 350, 360.

It has presently been found that the conventional p+ and n+ diffused resistors 100, 200, illustrated in FIGS. 1 and 2 have parasitic capacitances associated therewith. It is believed that the parasitic capacitance arises because of a depletion region that forms at a p-n junction of each. The depletion region, in such an instance, tends to behave like an insulator located between two conductors, wherein the doped resistor region and the tub region behave like the two conductors. It is thought that a voltage differential across the p-n junction associated with diffused resistor tends to cause undesirable current leakage and power dissipation in high frequency semiconductor devices.

Accordingly, it has been found that by negating or counterbalancing the voltage differential associated with such high frequency semiconductor devices, the parasitic capacitance is substantially reduced. The exemplary resistor of FIG. 3, which is within the scope of the present invention, substantially diminishes the voltage differential across the doped tub 320 and doped resistor region 325, by using the first terminal 330 that contacts the doped tub 320 and the doped resistor region 325, and the opposing second terminal 335 that contacts the doped tub 320 and the doped resistor region 325. This unique configuration substantially negates or counterbalances the effective parasitic capacitance. For example, at any line 340 drawn perpendicularly through the p-n junction of the doped tub 320 and the doped resistor region 325, a substantially similar voltage may be realized. Accordingly, the first and second terminals 330, 335 cause the doped tub 320 and doped resistor region 325 to have a zero potential difference at any point across a junction therebetween, when a voltage is applied to the first and second terminals 330, 335.

Figure 4:
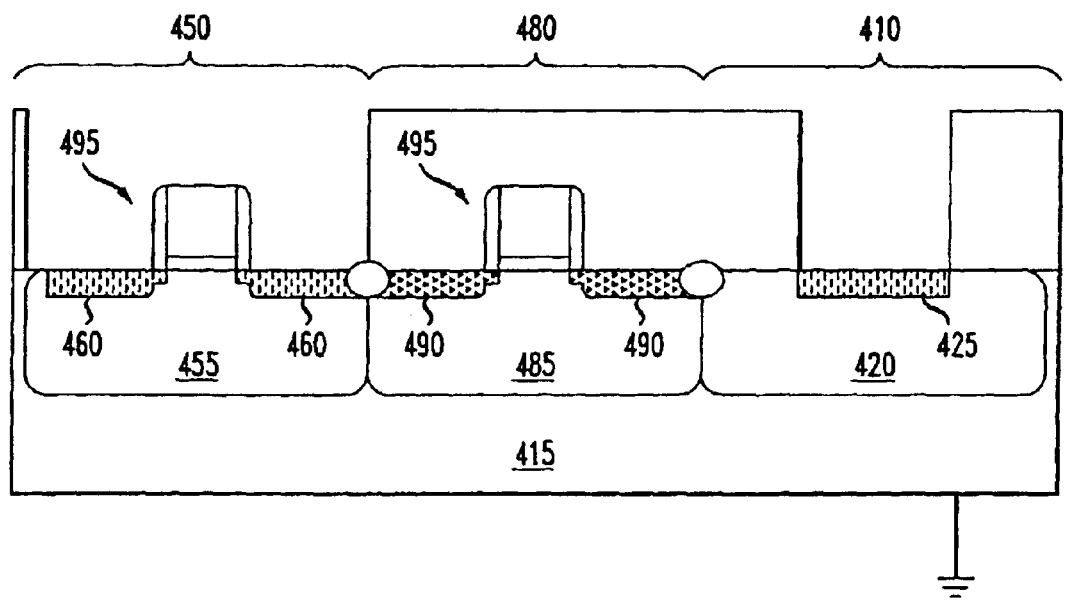
FIG. 4 illustrates a partially completed high dopant concentration diffused resistor constructed in accordance with the principles of the present invention, and more specifically, the formation of a doped resistor region.
Figure 5:
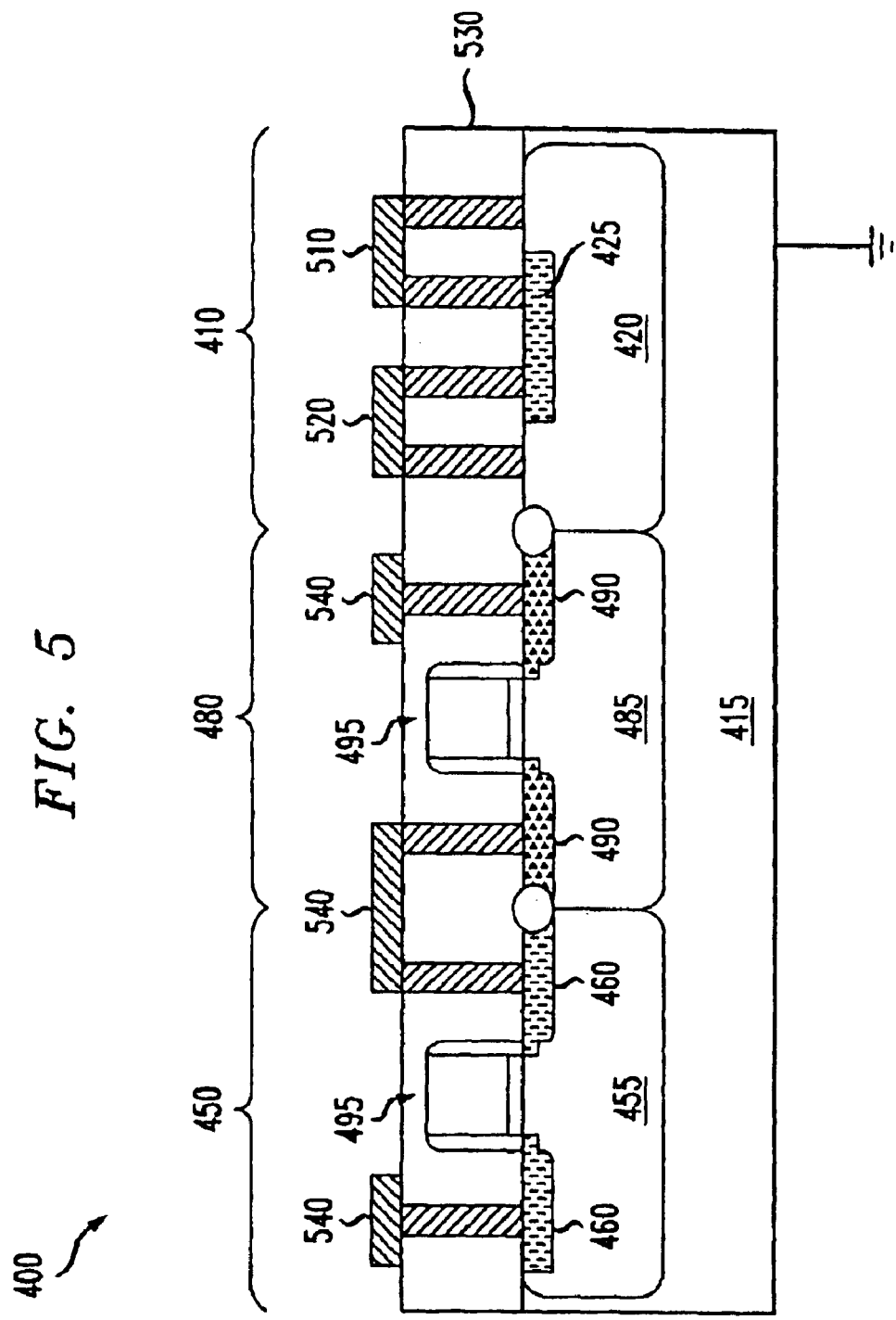
FIG. 5 illustrates the partially completed high dopant concentration diffused resistor illustrated in FIG. 4, after formation of a first terminal and a second terminal, each contacting both the doped resistor region and a doped tub.

Turning to FIGS. 4 and 5, illustrated are detailed manufacturing steps illustrating how one skilled in the art might manufacture a device similar to the partially completed integrated circuit illustrated in FIG. 3. FIG. 4 illustrates a cross-sectional view of a partially completed integrated circuit 400 at an intermediate manufacturing step. The partially completed integrated circuit 400 includes a partially completed p+ diffused resistor region 410, and conventional transistor regions 450, 480, all of which are located over a semiconductor substrate 415. By way of example, the transistor regions 450, 480 may be located adjacent the partially completed p+ diffused resistor region 410. However, other design layouts are also within the scope of the present invention.

The semiconductor substrate 415 may, in an exemplary embodiment, be any layer located in the integrated circuit 400, including a wafer itself or a layer located above the wafer. In the embodiment illustrated in FIG. 4, the semiconductor substrate 415 is a p-type substrate; however, one skilled in the art understands that the semiconductor substrate 415 could be an n-type substrate, without departing from the scope of the present invention. It should also be noted that in an exemplary embodiment the semiconductor substrate 415 may be grounded.

In the embodiment shown in FIG. 4, the transistor regions 450, 480, include an n-type transistor tub 455 and a p-type transistor tub 485, respectively. The type of dopant used to form the transistor tubs may, however, be reversed without departing from the scope of the present invention. One having skill in the art understands how to form the n-type transistor tub 455 and the p-type transistor tub 485, including protecting a region with a photoresist mask and subjecting an unprotected region to a desired dopant.

The transistor regions 450, 480, further include conventionally formed source and drain regions 460, 490, respectively. In the embodiment that includes the n-type transistor tub 455 and the p-type transistor tub 485, the source and drain regions 460, 490 would be p-type doped and n-type doped, respectively. It should be well understood, however, in the case where the dopant included within the transistor tubs is reversed, the dopant included within the source and drain regions 460, 490, would also be reversed. The transistor regions 450, 480, may further include conventional transistors 495, including gate oxides, polysilicon gates and oxide spacers.

As previously stated, the partially completed integrated circuit 400 includes the partially completed p+ diffused resistor region 410. The partially completed p+ diffused resistor region 410 includes a doped tub 420. The doped tub 420, in a previous step not shown, was doped with a first dopant. In an exemplary embodiment of the invention, the first dopant is an n-type dopant, for example phosphorous or arsenic, and is doped to a concentration of about 1E16 atoms/cm$^3$ to about 1E17 atoms/cm$^3$. It should be noted, however, in situations where the semiconductor substrate 415 is an n-type semiconductor substrate, as discussed above, the first dopant would comprise a p-type dopant having a concentration of about 1E16 atoms/cm$^3$ to about 1E17 atoms/cm$^3$. One having skill in the art understands the desire to have opposite dopant types for the doped tub 420 and the semiconductor substrate 415. Advantageously, the doped tub 420 may be formed concurrently with the similarly doped n-type transistor tub region 455. One having skill in the art understands how this may be accomplished with various masking steps. This aspect of the present invention is, of course, desirable because the concurrent formation of the doped tub 420 and the similarly doped n-type transistor tub region 455 saves valuable time and money.

Also included within the partially completed p+ diffused resistor region 410 is a doped resistor region 425 located within the doped tub 420. The doped resistor region 425, in an exemplary embodiment, includes a second dopant, opposite to that of the first dopant included within the doped tub 420. Thus, in situations where the doped tub 420 includes the n-type dopant, the doped resistor region 425 would include a p-type dopant, such as boron. The inverse would, again, also hold true where the doped tub 420 includes the p-type dopant and the semiconductor substrate 415 is an n-type substrate. The second dopant may have a concentration ranging from about 1E18 atoms/cm$^3$ to about 1E19 atoms/cm$^3$, which is similar to the dopant concentration included within the source and drain regions 460, 490. In the illustrative embodiment shown in FIG. 4, the doped resistor region 425 may be formed concurrently with the similarly doped source and drain regions 460. While it is desirable that the doped resistor region 425 and the similarly doped source and drain regions 460 be concurrently formed, it should be noted that the doped resistor region 425 may nonetheless be formed in an independent manufacturing step.

Turning now to FIG. 5, illustrated is a cross-sectional view of the partially completed integrated circuit 400 illustrated in FIG. 4, after formation of a first terminal 510 and an opposing second terminal 520. The first terminal 510 and the opposing second terminal 520 are formed in a conventionally deposited interlevel dielectric layer 530 that overlays both the conventional transistors 495 and the partially completed p+ diffused resistor region 410. The first terminal 510 and the opposing second terminal 520 may be formed using conventional photolithographic processes to develop vias in the interlevel dielectric. Once the vias are formed, they are then filled with a conductive material, such as metal, and patterned with conventional processes to complete the terminals 510 and 520.

One skilled in the art understands the processes by which the layer of interconnect material may be formed, including conventional chemical vapor deposition (CVD), physical vapor deposition (PVD), or other similar known processes. The layer of interconnect material may comprise any known or hereinafter discovered conductive material generally used in the manufacture of semiconductor devices.

Figure 6:
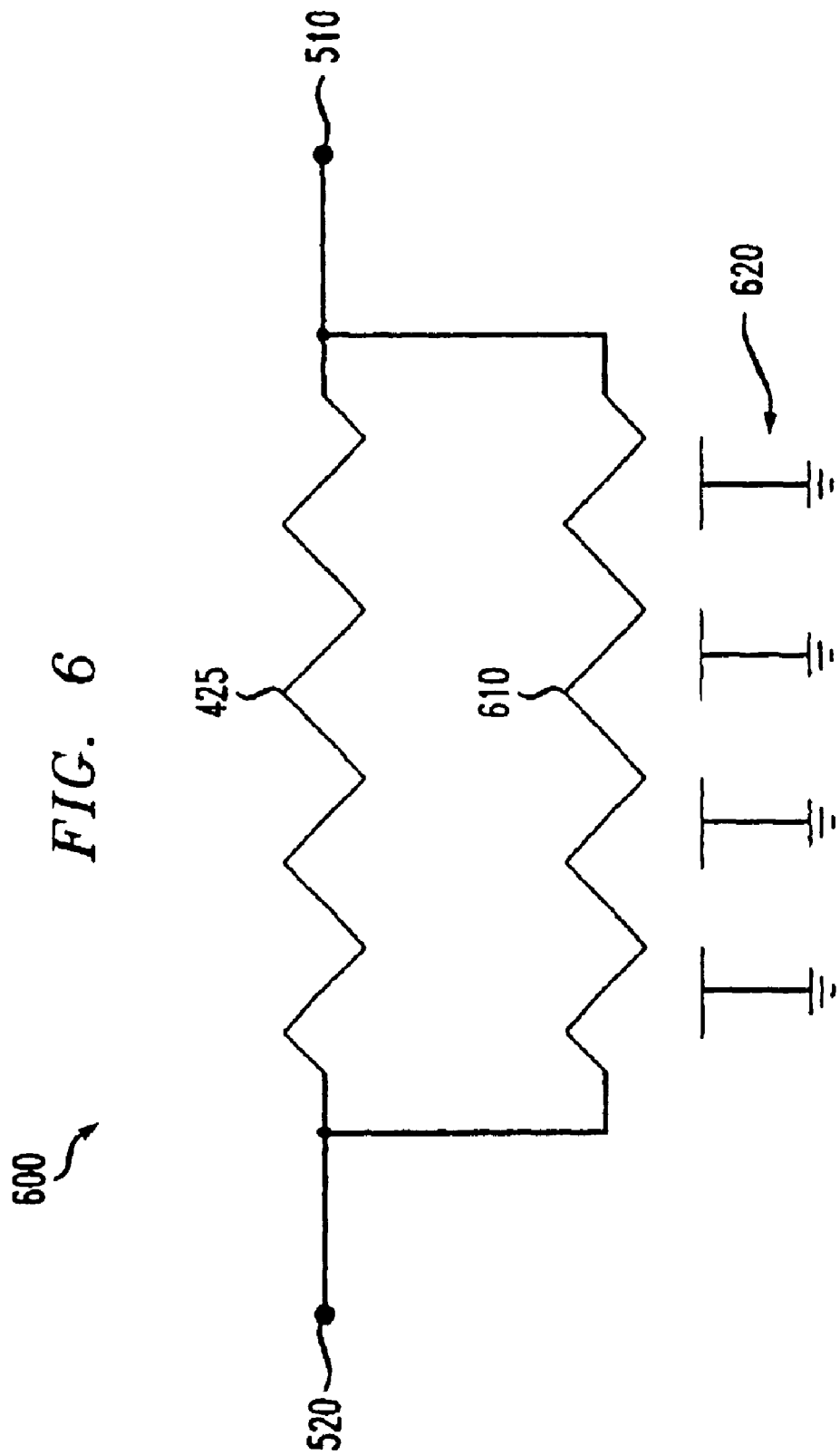
FIG. 6 illustrates a diagram showing the parallel resistors formed as a result of the first and second terminal formation of FIG. 5.

As illustrated in FIG. 5, the first terminal 510 contacts the doped tub 420 and the doped resistor region 425, while the opposing second terminal 520 also contacts the doped tub 420 and the doped resistor region 425. Turning briefly to FIG. 6, with continued reference to FIG. 5, illustrated is a circuit diagram 600 representing the p+ resistor region 410 illustrated in FIG. 5. As a result of the unique terminal configuration, the doped tub 420 behaves like a tub resistor 610, wired in parallel with the doped resistor region 425. As illustrated, there is no voltage differential across the tub resistor 610 and the doped resistor region 425. In accordance with the principles of the present invention, this substantially reduces the parasitic capacitance, and therefore, substantially reduces the current leakage and power dissipation associated with the p+ resistor region 410. Even though it is shown that there is a distributed capacitance 620 between the doped tub 420 (e.g., the tub resistor 610) and the semiconductor substrate 415, the capacitance is relatively small because of the reduced dopant concentrations of the two layers.

Figure 7:
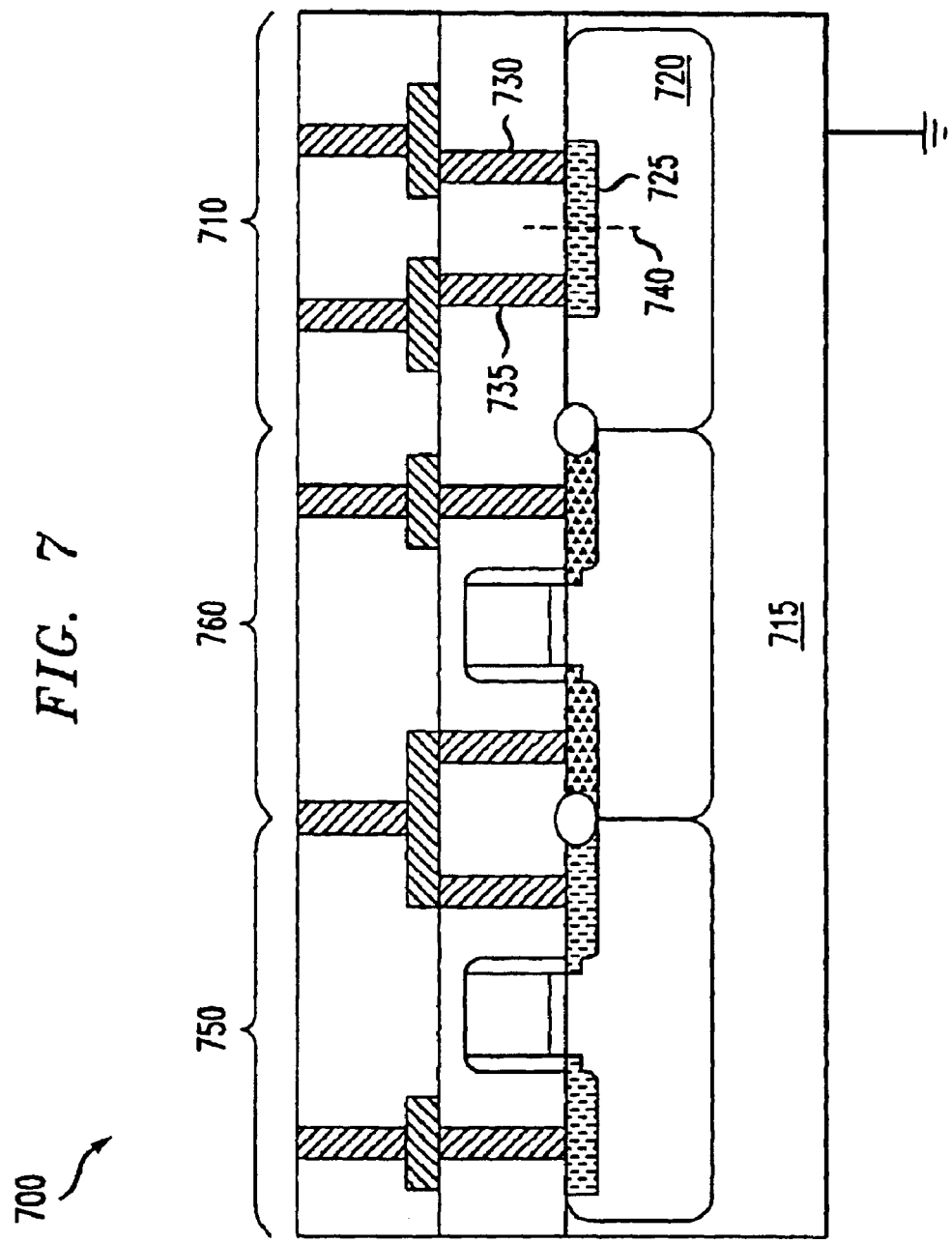
FIG. 7 illustrates a partially completed n+ diffused resistor in accordance with the principles of the present invention.

Turning now to FIG. 7, illustrated is a cross-sectional view of an alternative embodiment of a partially completed integrated circuit 700 constructed in accordance with the principles of the present invention. The partially completed integrated circuit 700 in the embodiment illustrated in FIG. 7 includes an alternative embodiment of the completed high dopant concentration diffused resistor illustrated in FIG. 3. The partially completed integrated circuit 700 in the embodiment illustrated in FIG. 7 includes a completed n+ diffused resistor region 710 located over a semiconductor substrate 715. In an advantageous embodiment, the completed n+ diffused resistor region 710 includes a doped tub 720 located over the semiconductor substrate 715, and a doped resistor region 725 located within the doped tub 720.

In the particular embodiment shown, the doped tub 720 and the doped resistor region 725 both include the same type of dopant, however, the doped resistor region 725 includes a higher concentration of the dopant than the doped tub 720. For instance, in an exemplary embodiment the doped tub 720 includes an n-type dopant having a concentration of about 1E16 atoms/cm$^3$ to about 1E17 atoms/cm$^3$, while the doped resistor region 725 includes the n-type dopant to a concentration ranging from about 1E18 atoms/cm$^3$ to about 1E19 atoms/cm$^3$.

The completed n+ diffused resistor region 710, as illustrated, further includes a first terminal 730 that contacts the doped resistor region 725, and an opposing second terminal 735 that also contacts the doped resistor region 725. In contrast to the embodiment shown in FIG. 3, the first and second terminals 730, 735, do not also actually physically contact the doped tub 720. Nonetheless, the similar dopant between the doped tub 720 and the doped resistor region 725 causes them to have a substantially equal potential value at any two adjacent points on either side of the doped tub 720/doped resistor region 725 junction. Saying it another way, the similar dopant between the doped tub 720 and doped resistor region 725 causes them to have a zero potential difference at any point across a junction therebetween, when a voltage is applied to the first and second terminals 730, 735. Accordingly, the parasitic capacitance of the n+ diffused resistor region 710 is substantially reduced, similar to the p+ diffused resistor 310 of FIG. 3.

Figure 8:
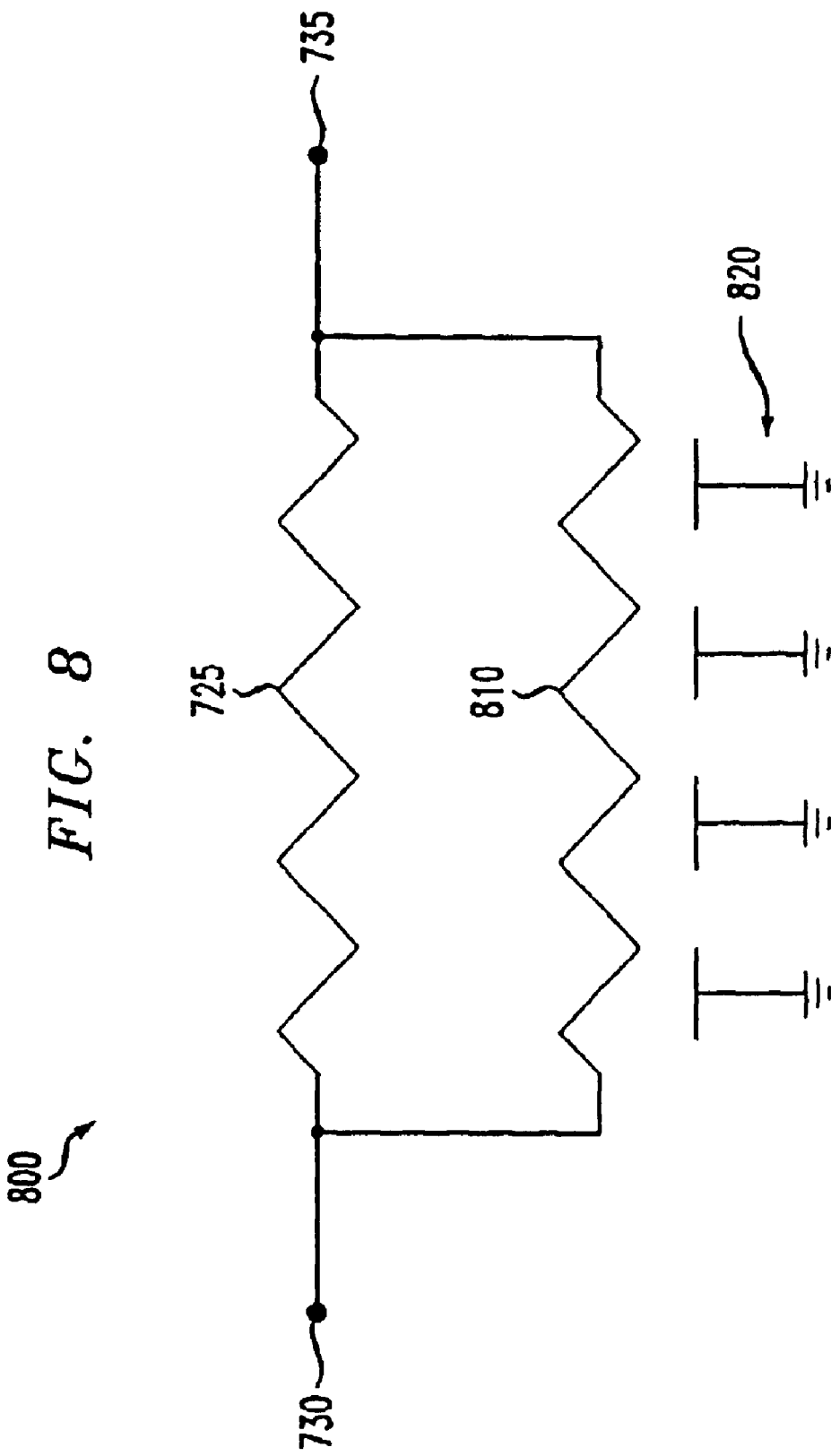
FIG. 8 illustrates a diagram showing the parallel resistors formed as a result of the similar dopant type used for the doped tub and the doped resistor region.

Turning briefly to FIG. 8, with continued reference to FIG. 7, illustrated is a circuit diagram 800 representing the n+ diffused resistor region 710 illustrated in FIG. 7. As a result of the similar dopant type between the doped tub 720 and the doped resistor region 725, and therefore conductivity therebetween, the doped tub 720 behaves like a tub resistor 810, wired in parallel with the doped resistor region 725. As illustrated, there is no voltage differential across the doped tub 720 and the doped resistor region 725, which substantially reduces the parasitic capacitance, and therefore, substantially reduces the current leakage and power dissipation associated with the n+ diffused resistor region 710. Even though it is shown that there is a distributed capacitance 820 between the doped tub 720 (e.g., the tub resistor 810) and the semiconductor substrate 715, the capacitance is relatively small because of the reduced dopant concentrations of the two layers. Further, current flowing through the doped tub 720 is also small because of its higher resistance. Accordingly, the net effect is quite beneficial.

Figure 9:
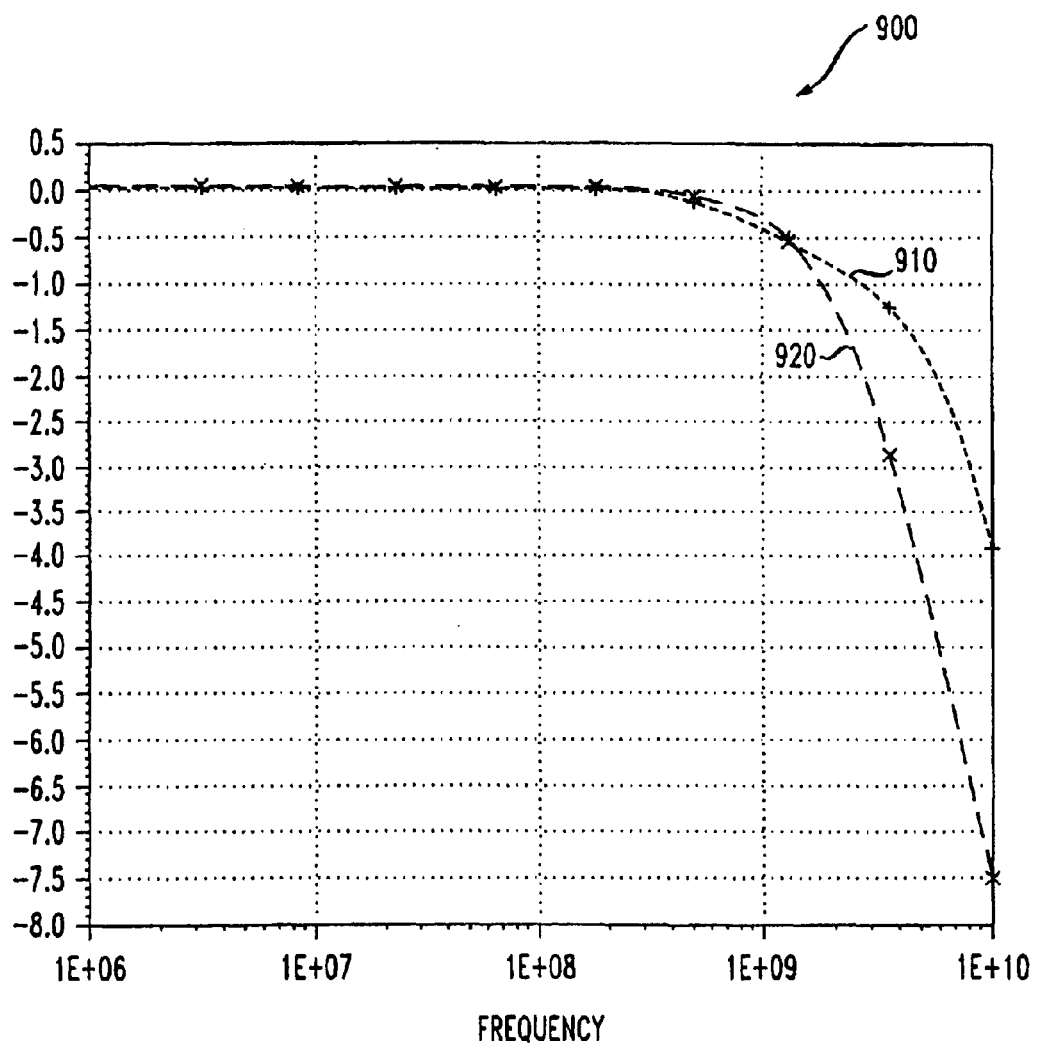
FIG. 9 illustrates an embodiment of the advantages realized by the p+ or n+ diffused resistors of FIGS. 3 and 7.

Turning now to FIG. 9, illustrated is a graph 900 illustrating one example of the benefits that may be realized using various aspects of the present invention. Graph 900 compares the frequency response of a novel n+ diffused resistor similar to that of FIG. 7 (e.g., with a doped tub underneath), to that of a conventional n+ diffused resistor (e.g., without a doped tub underneath). In the illustrative embodiment, line 910 represents the novel device and line 920 represents the conventional device. Graph 900 clearly shows that the bandwidth attainable at −3 dB for the conventional device is half of what is attainable for the novel device. As is noticed, similar benefits may be achieved at other voltages.

Figure 10:
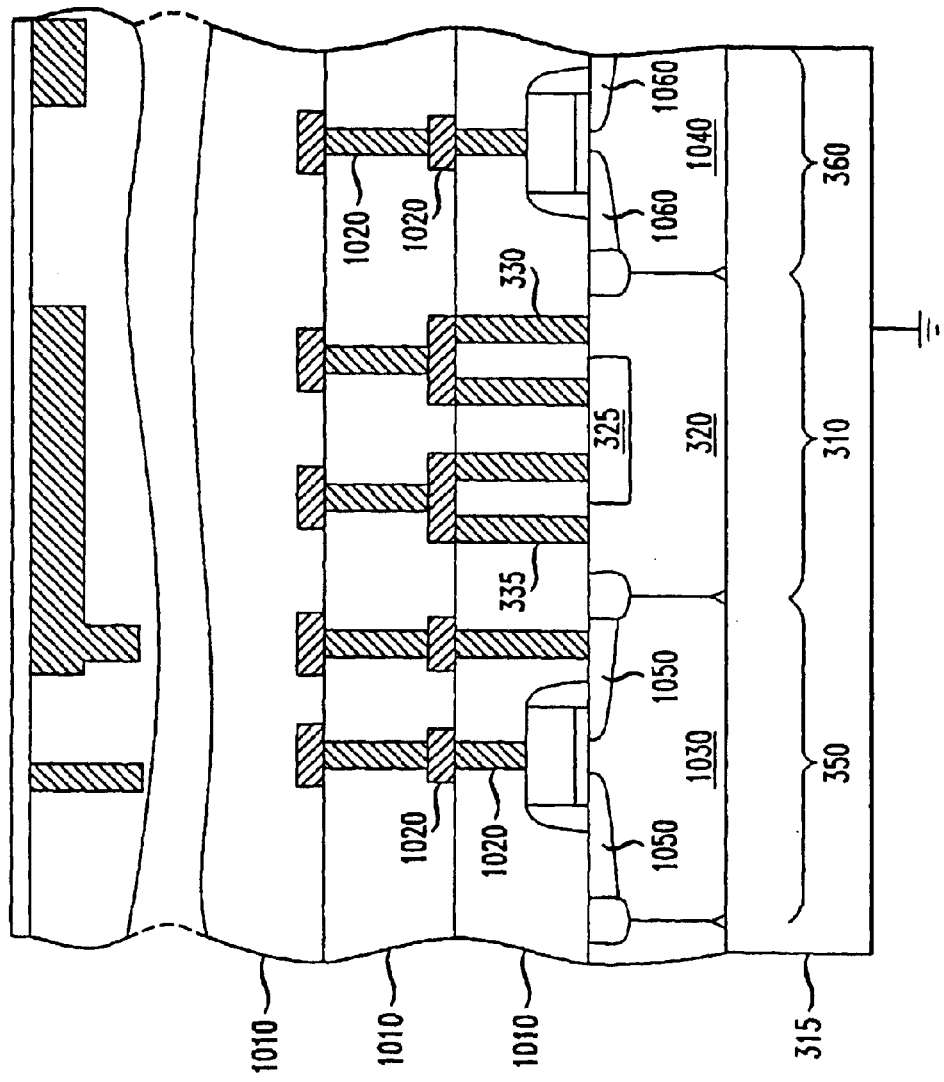
FIG. 10 illustrates a completed integrated circuit, which provides one environment where the resistor may be included.

Turning briefly to FIG. 10, with reference to FIG. 3, there is illustrated a cross-sectional view of a conventional integrated circuit 1000 that might include a completed resistor, similar to the above described completed resistor 310. The integrated circuit 1000 may include a CMOS device, a BiCMOS device, or other type of integrated circuit device. Shown in FIG. 10 are components of the conventional integrated circuit 1000, including: the transistor regions 350, 360, and dielectric layers 1010, in which interconnect structures 1020 are formed (together forming interconnect layers). Also included in the integrated circuit 1000 is the previously mentioned completed resistor 310, formed upon the semiconductor substrate 315. In the embodiment shown in FIG. 10, the interconnect structures 1020 connect the transistor regions 350, 360, to other areas of the integrated circuit 1000. Also shown in the integrated circuit 1000 illustrated in FIG. 10, are conventionally formed transistor tubs 1030, 1040, and source/drain regions 1050, 1060, respectively.

Although the present invention has been described in detail, those skilled in the art should understand that they can make various changes, substitutions and alterations herein without departing from the spirit and scope of the invention in its broadest form.

What is claimed is:

1. A method of manufacturing a high dopant concentration diffused resistor, comprising:

forming a doped tub in a semiconductor substrate;

forming a doped resistor region in the doped tub, the doped resistor region forming a junction within the doped tub; and forming fist and second terminals each contacting the doped tub and the doped resistor region, wherein the first and second terminals cause the doped tub and doped resistor region to have a zero potential difference at any point across the junction when a voltage is applied to the first and second terminals.

2. The method as recited in claim 1 wherein forming the doped tub includes forming a tub resistor, and the tub resistor and the doped resistor region function as parallel resistors.

3. The method as recited in claim 1 wherein the semiconductor substrate is a p-type substrate and forming the doped tub includes doping the doped tub with an n-type dopant and forming the doped resistor region includes doping the doped resistor region with a p-type dopant.

4. The method as recited in claim 3 wherein doping the doped tub with an n-type dopant includes doping the doped tub to a concentration ranging from about 1E16 atoms/cm$^3$ to about 1E17 atoms/cm$^3$, and doping the doped resistor region with a p-type dopant includes doping the doped resistor region to a concentration ranging from about 1E18 atoms/cm$^3$ to about 1E19 atoms/cm$^3$.

5. The method as recited in claim 1 further including forming at a least one transistor adjacent the resistor, and connecting the at least one transistor and the resistor to form an creative integrated circuit.

6. The method as recited in claim 5 wherein forming at least one transistor includes forming source and drain regions simultaneously with the doped resistor region.

7. A method of manufacturing a high dopant concentration diffused resistor, comprising:

forming a doped tub over a semiconductor substrate and having a concentration of a first dopant;

forming a doped resistor region in the doped tub and having a higher concentration of the first dopant; and forming a first terminal contacting the doped resistor region at a first location and an opposing second terminal contacting the doped resistor region at a second location, wherein the similar dopant between the doped tub and doped resistor region cause them to have a zero potential difference at any point across a junction therebetween when a voltage is applied to the first and second terminals.

8. The method as recited in claim 7 wherein forming the doped tub includes forming a tub resistor, and the tub resistor and the doped resistor region function as parallel resistors.

9. The method as recited in claim 7 wherein the semiconductor substrate is a p-type substrate and forming the doped tub and the doped resistor region includes doping the doped tub and doped resistor region with an n-type dopant.

10. The method as recited in claim 9 wherein doping the doped tub with an n-type dopant includes doping the doped tub to a concentration ranging from about 1E16 atoms/cm$^3$ to about 1E17 atoms/cm$^3$, and doping the doped resistor region with the n-type dopant includes doping the doped resistor region to a concentration ranging from about 1E18 atoms/cm$^3$ to about 1E19 atoms/cm$^3$.

11. The method as recited in claim 7 further including forming at least one transistor adjacent the resistor, and connecting the at least one transistor and the resistor to form an operative integrated circuit.

12. The method as recited in claim 11 wherein forming at least one transistor includes forming source and drain regions simultaneously with forming the doped resistor region.

* * * * *